United States Patent [19]
Kihara

[11] Patent Number: 4,787,068
[45] Date of Patent: Nov. 22, 1988

[54] MOS-TYPE MEMORY CIRCUIT

[75] Inventor: Yuji Kihara, Itami, Japan

[73] Assignee: Mitsubishi Denki Kabushiki Kaisha, Japan

[21] Appl. No.: 32,551

[22] Filed: Apr. 1, 1987

[30] Foreign Application Priority Data

Apr. 2, 1986 [JP] Japan ................... 61-77412

[51] Int. Cl.⁴ ............................... G11C 8/00
[52] U.S. Cl. ..................... 365/230; 365/203
[58] Field of Search .......... 365/189, 190, 203, 230, 365/233

[56] References Cited

U.S. PATENT DOCUMENTS

| | | | |
|---|---|---|---|
| 4,099,265 | 7/1978 | Abe | 365/190 |
| 4,338,679 | 7/1982 | O'3 Toole | 365/203 |
| 4,558,435 | 12/1985 | Hsieh | 365/203 |
| 4,616,342 | 10/1986 | Miyamoto | 365/190 |

*Primary Examiner*—Joseph A. Popek
*Attorney, Agent, or Firm*—Leydig, Voit & Mayer

[57] ABSTRACT

A MOS-type memory circuit comprising a terminal end potential feeder circuit which applies a voltage of certain level between a supply voltage and a ground potential to terminal ends of word lines when memory addresses change-over.

11 Claims, 4 Drawing Sheets

MOS-TYPE MEMORY CIRCUIT

BACKGROUND OF THE INVENTION

This invention relates to a MOS-type memory circuit constructed of a high-speed static RAM, etc., and more particularly to a MOS-type memory circuit which reduces the delays of word lines thereby to attain a raised operating speed and to realize the widening of a "write" timing margin.

FIG. 1 shows the word lines of a prior-art static RAM and the peripheral circuits thereof. Referring to the figure, symbols 1D–nD denote NAND circuits for decoders, and symbols 1I–nI denote inverters for word line drivers. Symbols 11–nn indicate memory cells, each of which is configured of two resistance elements and four transistors as illustrated in FIG. 2 by way of example. Further, the static RAM includes word lines 1W–nW and bit lines B1–Bn, $\overline{B1}$–$\overline{Bn}$. Shown at symbols 1a–na, 1b–nb, and 1c–nc are nodes.

Next, the operation of the static RAM will be described. Each of the decoders 1D–nD is constructed of the NAND circuit, the output of which becomes an "L" (low) level only when all the inputs thereof are at an "H" (high) As a result, only one of the nodes 1a–na becomes the "L" level. Accordingly, only one of the word lines 1W–nW is brought to the "H" level by the inverters 1I–nI. Thus, the data items of all the cells connected to the word lines brought to the "H" level are delivered to the corresponding bit lines B1–Bn. Herein, since the word lines are usually wired of polycrystalline silicon, they have resistances of certain value. Meanwhile, since each of the word lines forms the gates of the access transistors Q5, Q6 of the memory cell M.C. shown in FIG. 2, it has a gate capacitance of certain value. The resistances and the capacitances constitute distributed constant circuits. In consequence, operating waveforms differ greatly between the base ends of the word lines, namely, the ends to which the inverters 1I–nI for the word line drivers are connected, and at the distal ends of the word lines, namely, the ends which are opposite to the base ends, and the nodes 1c–nc on the distal end side undergo great delays with respect to the nodes 1b–nb on the base end side.

Since the prior-art MOS-type memory circuit is constructed as described above, it has been inevitable that each word line operates as a distributed constant circuit having a certain time constant and incurs a delay. The division of the word line has been performed as expedients for solving this problem. With the increase in memory capacity, however, it has been limited in relation to a chip size to suppress the word line delay to an infinitesimal value.

SUMMARY OF THE INVENTION

This invention has the objective of eliminating the problem as stated above, and has for its main object to provide a MOS-type memory circuit which can suppress word line delays and which can also achieve the expansion of the timing margin of a writing system.

The MOS-type memory circuit according to this invention includes a circuit which fixes word lines to a certain level between a supply voltage and a ground voltage when an address changes is added to the distal ends of the word lines.

In the MOS-type memory circuit according to this invention, the delays at the distal ends of the word lines are suppressed by the voltage of the intermediate level applied to these distal ends of the word lines, whereby the overall delay of the memory circuit is suppressed.

BRIEF DESCRIPTION OF THE DRAWINGS

Throughout the drawings, the same symbols indicate identical or corresponding portions.

DESCRIPTION OF THE PREFERRED EMBODIMENTS

Now, an embodiment of this invention will be described with reference to the drawings.

Figure 4:
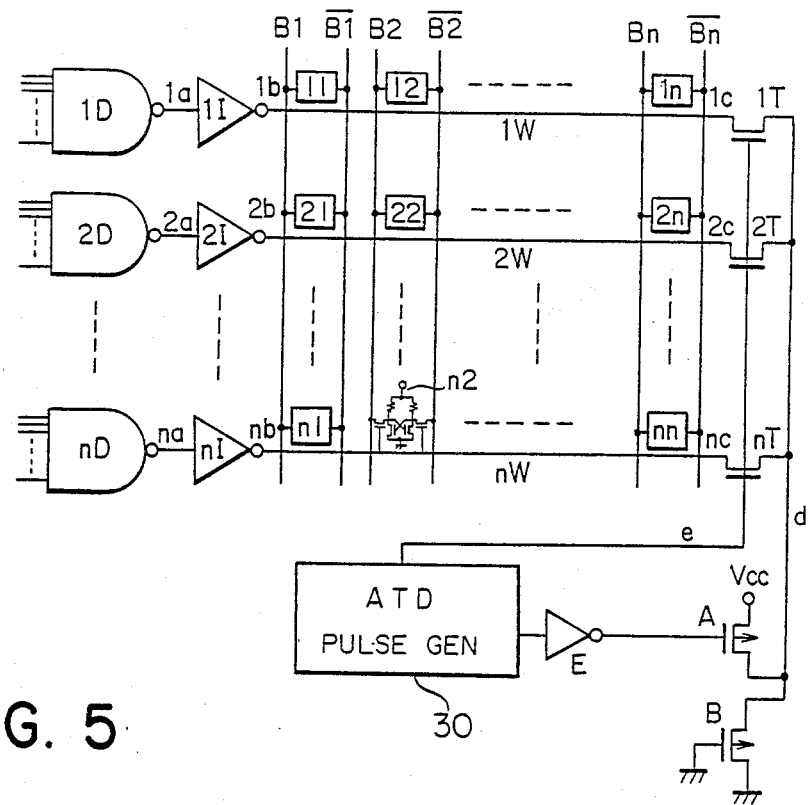
FIG. 4 is a circuit diagram of a MOS-type memory circuit which is an embodiment of the present invention.

FIG. 4 is a circuit diagram which shows a MOS-type memory circuit according to one embodiment of this invention. In the figure, symbols 1D–nD denote NAND circuits for decoders, symbols 1I–nI inverters, symbols 11–nn memory cells, symbols 1T–nT n-channel transistors, letters A and B p-channel transistors, and letter E an inverter.

In additions, symbols 1a–na, 1b–nb, 1c–nc, d, and e indicate nodes.

Figure 1:
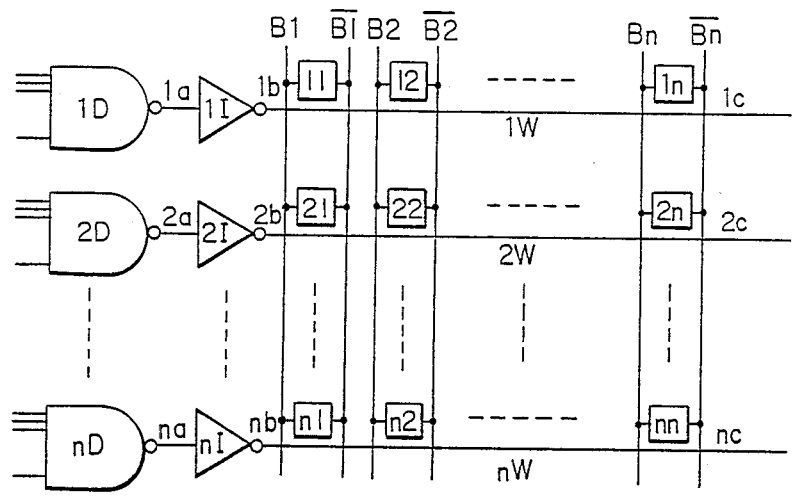
FIG. 1 is a circuit diagram of a prior-art circuit including word lines.
Figure 2:
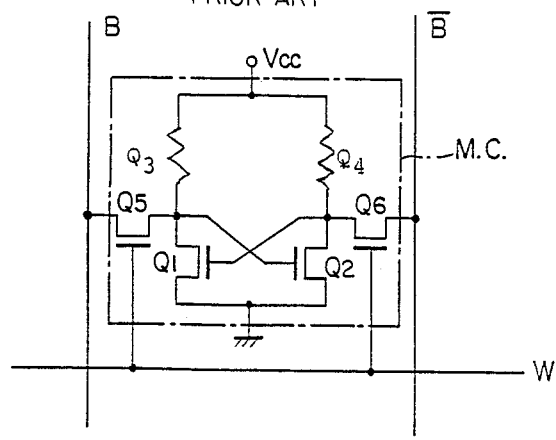
FIG. 2 is a circuit diagram of a memory cell.
Figure 3:
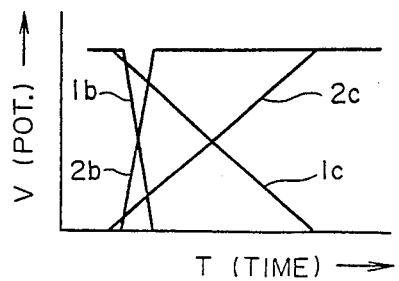
FIG. 3 is an operating waveform diagram of the circuit in FIG. 1.
Figure 5:
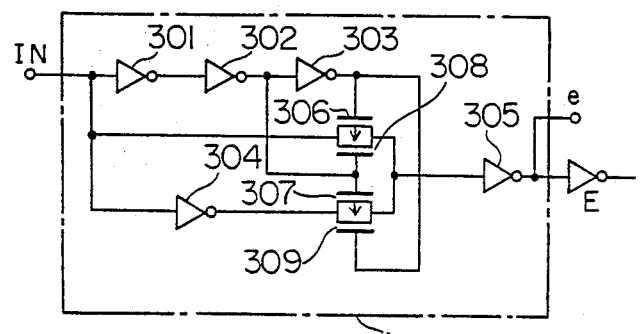
FIG. 5 is a circuit diagram of an ATD pulse generator.

The arrangement of the decoder and driver circuit composed of the NAND circuits 1D–nD and the inverters 1I–nI, and the arrangement of each of the memory cells 11–nn are the same as in the prior-art circuit shown in FIG. 1. The n-channel transistors 1T–nT are connected to the terminal ends of respective word lines 1W–nW. The gates of these transistors are connected to an ATD (Address Transition Detection) pulse generator 30, while the drains thereof are connected to the node d. Here, the ATD pulse generator 30 is a circuit which generates a pulse when an address changes, that is, when a new access has occurred. As shown in FIG. 5, it is usually configured of five inverters 301–305, two p-channel MOS transistors 306, 307 and two n-channel MOS transistors 308, 309, and the input IN thereof is supplied with a signal which indicates the change of the address. Owing to the p-channel transistor B, the node d lies at a potential which is higher than the ground potential GND by the threshold voltage $V_{THP}$ of this transistor B. Accordingly, the potential of the node d is ordinarily 0.7–0.8V. Since the transistor A is of the p-channel, it is supplied as an input with a signal which is opposite in phase to the output of the ATD pulse generator 30. Thus, this transistor A turns ON when the n-channel transistors 1T–nT are in the ON states.

Figure 6:
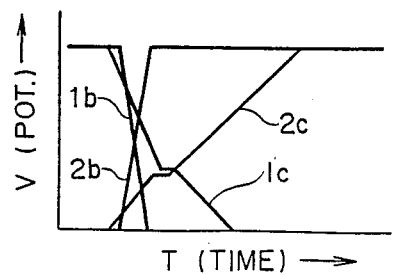
FIG. 6 is an operating waveform diagram of word lines in the circuit of FIG. 4.

In a case where the selected decoder changes from 1D to 2D because of the address change, the potential of the node 1b being the base end of the word line falls rapidly, and that of the node 2b rises rapidly. Meanwhile, with the address change, the pulse is produced from the ATD pulse generator 30, to turn ON the n-channel transistors 1T-nT and the p-channel transistor A. Then, the potential of the node 1c which was at the "H" level before the address change falls rapidly down to a level (1 $V_{THP}$) which is stipulated by the transistor B. On the other hand, the potentials of the nodes 2c-nc are about to rise simultaneously because the transistor A turns ON. Herein, the value $V_0$ to which these potentials rise is stipulated by the width of the pulse delivered from the ATD pulse generator 30 and the driving force $\beta$ of the transistor A. The pulse width generated by the ATD pulse generator 30 is selected such that at the point of time at which voltages at nodes 1c-nc reach their steady state values coming from drivers 1I-nI via the respective word lines, the transistors 1T-nT and A are OFF. Accordingly, the potential of the terminal end 2c of the word line 2W selected anew may rise from the value $V_0$, not from 0 (V), therefore decreasing the required voltage swing to reach the steady state values. Therefore, the access becomes faster to that extent. The potential value $V_0$ on this occasion depends upon the width (usually, 5-20 ns) of the pulse from ATD pulse generator 30 and the dimensions of the transistors A and B. In addition, the word lines 1W and 3W-nW having become non-selected at this time are restored to the GND level by the corresponding inverters 1I and 3I-nI when the ATD pulse disappears. The relationship among the nodes 1b, 2b and the nodes 1c, 2c stated above is illustrated in FIG. 6.

As described above, according to the present embodiment, the circuit is disposed which is composed of the transistors 1T-nT, A and B and the ATD pulse generator 30 and which applies the predetermined voltage to the terminal ends of the word lines at the change-over of addresses, whereby the address change-over becomes faster at only the terminal ends of the word lines without exerting influence on the base ends of the word lines, and also a characteristic in a writing mode is improved.

Figure 7:
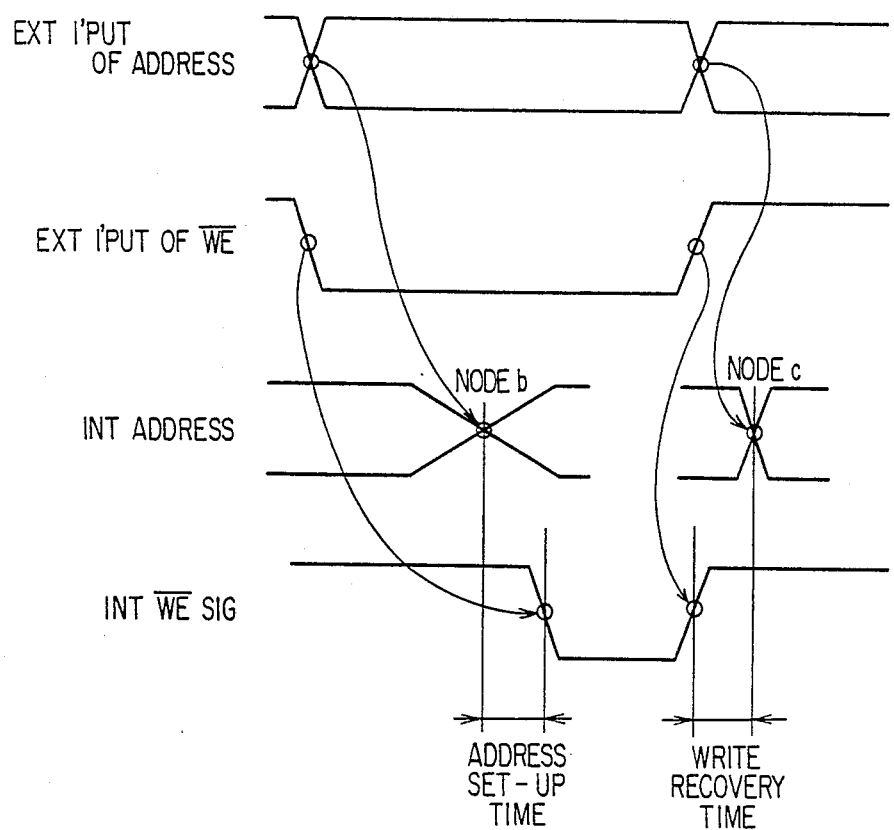
FIG. 7 is a conceptual diagram showing the margin of a writing characteristic.

As illustrated in FIG. 7, an address set-up time which is taken from the change-over of internal addresses till the fall of an internal $\overline{WE}$ signal, in the case where the change-over of the addresses of external inputs and the rise of an external $\overline{WE}$ signal occur at the same time, becomes the greatest for an address of the slowest access at the terminal ends (nodes c) of the word lines. On the other hand, a write recovery time which is taken from the rise of the internal $\overline{WE}$ signal till the change-over of the internal addresses in the same case as stated above becomes the greatest for an addess of the fastest access at the base ends (nodes b) of the word lines. Regarding these facts, in the present embodiment, the foregoing construction raises the speeds of signals at only the terminal ends of the word lines without affecting the base ends thereof, so that the characteristic of the address set-up time becomes better, and the timing margin of a writing system can be widened.

Figure 8:
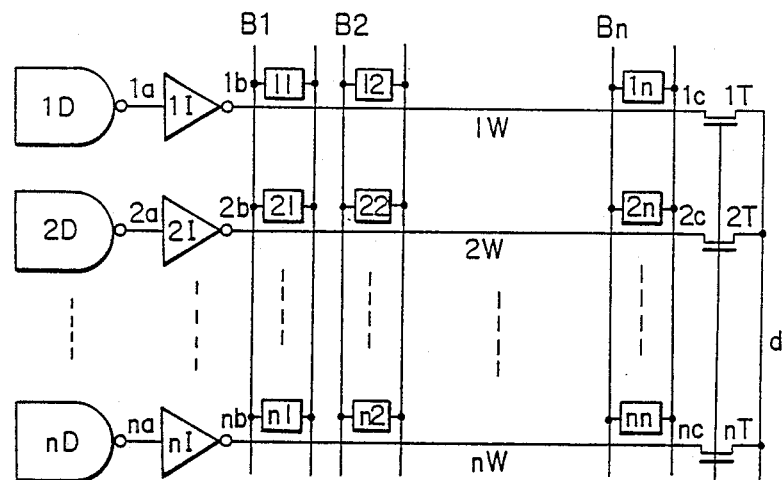
FIG. 8 is a circuit diagram of a MOS-type memory circuit which is another embodiment of the present invention.
Figure 9:
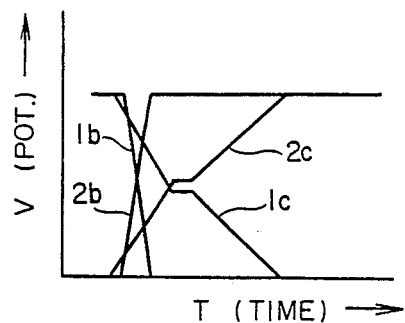
FIG. 9 is an operating waveform diagram of the circuit in FIG. 8.

In the foregoing embodiment, the p-channel transistors A and B have been employed for producing the intermediate potential $V_0$. In this regard, a method is also considered in which, using an inverter composed of transistors E and F as shown in FIG. 8, the potential $V_0$ is forcibly determined by the beta ratio of the inverter, namely, the ratio between the driving force $\beta$ of the p-channel MOS transistor E and the driving force $\beta$ of the n-channel MOS transistor F. The relationship among the nodes 1b, 2b and the nodes 1c, 2c on this occasion is illustrated in FIG. 9. Letter G in FIG. 8 indicates a transistor for cutting power.

As thus far described, according to this invention, a circuit which applies a voltage at an intermediate level between a supply voltage and a ground potential to the terminal ends of word lines is disposed, and the speeds of signals are heightened at only the terminal ends of the word lines without exerting influence on the base ends of the word lines. Therefore, the invention brings forth the effects that the access time of a memory circuit becomes shorter and that the margin of an address set-up time can be expanded.

What is claimed is:
1. A MOS-type memory circuit comprising:
   a plurality of memory cells arranged in a matrix,
   word lines, each of which is connected to a row of said memory cells, said word lines having base ends receiving signals to access memory cells at different addresses, and said word lines having terminal end, and
   a terminal end potential feeder circuit which applies a predetermined voltage having a potential level between a supply voltage and a ground potential to said terminal ends of said word lines during an address transition to speed up access by reducing voltage swing at said terminal ends of said word lines to reach steady state values determined by the signals applied to said base ends of said word lines.
2. A MOS-type memory circuit according to claim 1 wherein said terminal end potential feeder circuit comprises:
   an address transition detection (ATD) pulse generator which generates a pulse upon sensing an address transition,
   a potential generator delivering said predetermined voltage level to an output end thereof, and
   switching means connected between said terminal ends of said word lines and the output of said potential generator and operated to conduct upon receiving the pulse generated by said ATD pulse generator.
3. A MOS-type memory circuit according to claim 2 wherein said potential generator includes an inverter circuit which provides the predetermined voltage at the output end upon receiving the pulse from said ATD pulse generator.
4. A MOS-type memory circuit according to claim 3 wherein said inverter circuit is composed of a p-channel MOS transistor which receives the pulse from said ATD pulse generator, and an n-channel MOS transistor which is connected in series with said p-channel MOS transistor.
5. A MOS-type memory circuit according to claim 3 wherein said inverter circuit comprises a first n-channel MOS transistor which receives the pulse from said ATD pulse generator, and a p-channel MOS transistor and a second n-channel MOS transistor which are connected in series with said first n-channel MOS transistor.
6. A MOS-type memory circuit comprising:
   a plurality of memory cells arranged in a matrix shape,
   bit lines, each of which is connected to the memory cells, arranged in a corresponding column,
   word lines, each of which is connected to the memory cells, arranged in a corresponding row and has an initial end fed with a potential conforming to an address input, said word lines having terminal ends, an address transition detection (ATD) pulse generator which generates a pulse upon sensing that the address input has changed, a potential generator connected to said ATD pulse generator and delivering a predetermined voltage to an output end thereof responsive to the pulse from said ATD pulse generator, which predetermined voltage is at a potential level between a supply voltage and a ground potential, and switching means connected to said ATD pulse generator and between the terminal ends of said word lines and the output end of said potential generator and operated so as to conduct upon receiving the pulse generated by said ATD pulse generator, connect the predetermined voltage to the terminal ends of said word lines, and speed up access to said memory cell by reducing voltage swing at the terminal ends of said word lines.

7. A MOS-type memory circuit according to claim 6, wherein said each memory cell comprises a pair of driver MOS transistors which are cross-connected, and a pair of transfer MOS transistors which are respectively connected between output ends of said driver MOS transistors and the corresponding pair of bit lines and whose gates are connected to the corresponding word line.

8. A MOS-type memory circuit according to claim 7 wherein said word lines and said gates of said transfer MOS transistors are made of polycrystalline silicon.

9. A MOS-type memory circuit according to claim 7 wherein said potential generator includes an inverter circuit providing the predetermined voltage at the output end responsive to the pulse from said ATD pulse generator.

10. A MOS-type memory circuit according to claim 9 wherein said inverter circuit is comprised of a first p-channel MOS transistor which receives an inverted pulse from said ATD pulse generator and a second p-channel MOS transistor which is connected in series with said first p-channel MOS transistor.

11. A MOS-type memory circuit according to claim 9 wherein said inverter circuit comprises a first n-channel MOS transistor which receives the pulse from said ATD pulse generator, and a p-channel MOS transistor and a second n-channel MOS transistor which are connected in series with said first n-channel MOS transistor.

* * * * *